United States Patent
Wang et al.

(10) Patent No.: US 8,304,351 B2
(45) Date of Patent: Nov. 6, 2012

(54) IN-SITU OZONE CURE FOR RADICAL-COMPONENT CVD

(75) Inventors: Linlin Wang, Fremont, CA (US); Abhijit Basu Mallick, Palo Alto, CA (US); Nitin K. Ingle, San Jose, CA (US); Shankar Venkataraman, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 12/972,711

(22) Filed: Dec. 20, 2010

(65) Prior Publication Data

US 2012/0003840 A1      Jan. 5, 2012

Related U.S. Application Data

(60) Provisional application No. 61/293,082, filed on Jan. 7, 2010.

(51) Int. Cl.
*H01L 21/31* (2006.01)
*H01L 21/469* (2006.01)

(52) U.S. Cl. .................. 438/761; 257/E21.241

(58) Field of Classification Search .......... 438/761, 438/762, 775, 778, 784, 786, 787, 798; 427/255.18, 427/255.27; 257/E21.241
See application file for complete search history.

(56) References Cited

U.S. PATENT DOCUMENTS

| 4,147,571 A | 4/1979 | Stringfellow et al. |
| 4,200,666 A | 4/1980 | Reinberg |
| 4,816,098 A | 3/1989 | Davis et al. |
| 4,818,326 A | 4/1989 | Liu et al. |
| 4,931,354 A | 6/1990 | Wakino et al. |
| 4,946,593 A | 8/1990 | Pinigis |
| 5,016,332 A | 5/1991 | Reichelderfer et al. |
| 5,110,407 A | 5/1992 | Ono et al. |

(Continued)

FOREIGN PATENT DOCUMENTS

DE       19654737 A1      3/1997

(Continued)

OTHER PUBLICATIONS

Coltrin, M.E., et al., "Chemistry of AlGaN Particulate Formation," National Nuclear Security Administration, Physical, Chemical, & Nano Sciences Center, Research Briefs, 2005, pp. 42-43.

(Continued)

*Primary Examiner* — William D Coleman
*Assistant Examiner* — Christine Enad
(74) *Attorney, Agent, or Firm* — Kilpatrick Townsend & Stockton LLP

(57) ABSTRACT

Methods of forming a dielectric layer are described. The methods include the steps of mixing a silicon-containing precursor with a plasma effluent, and depositing a silicon-and-nitrogen-containing layer on a substrate. The silicon-and-nitrogen-containing layer is converted to a silicon-and-oxygen-containing layer by curing in an ozone-containing atmosphere in the same substrate processing region used for depositing the silicon-and-nitrogen-containing layer. Another silicon-and-nitrogen-containing layer may be deposited on the silicon-and-oxygen-containing layer and the stack of layers may again be cured in ozone all without removing the substrate from the substrate processing region. After an integral multiple of dep-cure cycles, the conversion of the stack of silicon-and-oxygen-containing layers may be annealed at a higher temperature in an oxygen-containing environment.

18 Claims, 6 Drawing Sheets

U.S. PATENT DOCUMENTS

| | | |
|---|---|---|
| 5,271,972 A | 12/1993 | Kwok et al. |
| 5,279,784 A | 1/1994 | Bender et al. |
| 5,393,708 A | 2/1995 | Hsia et al. |
| 5,426,076 A | 6/1995 | Moghadam |
| 5,468,687 A | 11/1995 | Carl et al. |
| 5,485,420 A | 1/1996 | Lage et al. |
| 5,530,293 A | 6/1996 | Cohen et al. |
| 5,547,703 A | 8/1996 | Camilletti et al. |
| 5,558,717 A | 9/1996 | Zhao et al. |
| 5,578,532 A | 11/1996 | van de Ven et al. |
| 5,587,014 A | 12/1996 | Leychika et al. |
| 5,620,525 A | 4/1997 | van de Ven et al. |
| 5,622,784 A | 4/1997 | Okaue et al. |
| 5,635,409 A | 6/1997 | Moslehi |
| 5,665,643 A | 9/1997 | Shin |
| 5,691,009 A | 11/1997 | Sandhu |
| 5,769,951 A | 6/1998 | van de Ven et al. |
| 5,786,263 A | 7/1998 | Perera |
| 5,811,325 A | 9/1998 | Lin et al. |
| 5,843,233 A | 12/1998 | van de Ven et al. |
| 5,853,607 A | 12/1998 | Zhao et al. |
| 5,882,417 A | 3/1999 | van de Ven et al. |
| 5,925,411 A | 7/1999 | van de Ven et al. |
| 5,935,340 A | 8/1999 | Xia et al. |
| 5,937,308 A | 8/1999 | Gardner et al. |
| 5,937,323 A | 8/1999 | Orczyk et al. |
| 6,008,515 A | 12/1999 | Hsia et al. |
| 6,009,830 A | 1/2000 | Li et al. |
| 6,014,979 A | 1/2000 | Van Autryve et al. |
| 6,017,791 A | 1/2000 | Wang et al. |
| 6,024,044 A | 2/2000 | Law et al. |
| 6,087,243 A | 7/2000 | Wang |
| 6,090,442 A | 7/2000 | Klaus et al. |
| 6,090,723 A | 7/2000 | Thakur et al. |
| 6,114,219 A | 9/2000 | Spikes et al. |
| 6,121,130 A | 9/2000 | Chua et al. |
| 6,140,242 A | 10/2000 | Oh et al. |
| 6,146,970 A | 11/2000 | Witek et al. |
| 6,156,394 A | 12/2000 | Yamasaki et al. |
| 6,156,581 A | 12/2000 | Vaudo et al. |
| 6,165,834 A | 12/2000 | Agarwal et al. |
| 6,180,490 B1 | 1/2001 | Vassiliev et al. |
| 6,207,587 B1 | 3/2001 | Li et al. |
| 6,287,962 B1 | 9/2001 | Lin |
| 6,302,964 B1 | 10/2001 | Umotoy et al. |
| 6,383,954 B1 | 5/2002 | Wang et al. |
| 6,387,207 B1 | 5/2002 | Janakiraman et al. |
| 6,406,677 B1 | 6/2002 | Carter et al. |
| 6,448,187 B2 | 9/2002 | Yau et al. |
| 6,469,283 B1 | 10/2002 | Burkhart et al. |
| 6,503,557 B1 | 1/2003 | Joret |
| 6,506,253 B2 | 1/2003 | Sakuma |
| 6,508,879 B1 | 1/2003 | Hashimoto |
| 6,509,283 B1 | 1/2003 | Thomas |
| 6,524,931 B1 | 2/2003 | Perera |
| 6,528,332 B2 | 3/2003 | Mahanpour et al. |
| 6,544,900 B2 | 4/2003 | Raaijmakers et al. |
| 6,548,416 B2 | 4/2003 | Han et al. |
| 6,548,899 B2 | 4/2003 | Ross |
| 6,559,026 B1 | 5/2003 | Rossman et al. |
| 6,566,278 B1 | 5/2003 | Harvey et al. |
| 6,583,063 B1 | 6/2003 | Kahn et al. |
| 6,589,868 B2 | 7/2003 | Rossman |
| 6,596,654 B1 | 7/2003 | Bayman et al. |
| 6,599,839 B1 | 7/2003 | Gabriel et al. |
| 6,602,806 B1 | 8/2003 | Xia et al. |
| 6,614,181 B1 | 9/2003 | Harvey et al. |
| 6,624,064 B1 | 9/2003 | Sahin et al. |
| 6,630,413 B2 | 10/2003 | Todd |
| 6,645,303 B2 | 11/2003 | Frankel et al. |
| 6,660,391 B1 | 12/2003 | Rose et al. |
| 6,667,553 B2 | 12/2003 | Cerny et al. |
| 6,670,284 B2 | 12/2003 | Yin |
| 6,676,751 B2 | 1/2004 | Solomon et al. |
| 6,682,659 B1 | 1/2004 | Cho et al. |
| 6,682,969 B1 | 1/2004 | Basceri et al. |
| 6,683,364 B2 | 1/2004 | Oh et al. |
| 6,706,634 B1 | 3/2004 | Seitz et al. |
| 6,716,770 B2 | 4/2004 | O'Neill et al. |
| 6,756,085 B2 | 6/2004 | Waldfried et al. |
| 6,762,126 B2 | 7/2004 | Cho et al. |
| 6,787,191 B2 | 9/2004 | Hanahata et al. |
| 6,794,290 B1 | 9/2004 | Papasouliotis et al. |
| 6,800,571 B2 | 10/2004 | Cheung et al. |
| 6,818,517 B1 | 11/2004 | Maes |
| 6,819,886 B2 | 11/2004 | Runkowske et al. |
| 6,830,624 B2 | 12/2004 | Janakiraman et al. |
| 6,833,052 B2 | 12/2004 | Li et al. |
| 6,833,322 B2 | 12/2004 | Anderson et al. |
| 6,835,278 B2 | 12/2004 | Selbrede et al. |
| 6,849,520 B2 | 2/2005 | Kim et al. |
| 6,858,523 B2 | 2/2005 | Deboer et al. |
| 6,858,533 B2 | 2/2005 | Chu et al. |
| 6,867,086 B1 | 3/2005 | Chen et al. |
| 6,872,323 B1 | 3/2005 | Entley et al. |
| 6,890,403 B2 | 5/2005 | Cheung |
| 6,900,067 B2 | 5/2005 | Kobayashi et al. |
| 6,955,836 B2 | 10/2005 | Kumagai et al. |
| 6,958,112 B2 | 10/2005 | Karim et al. |
| 7,018,902 B2 | 3/2006 | Visokay et al. |
| 7,077,904 B2 | 7/2006 | Cho et al. |
| 7,084,076 B2 | 8/2006 | Park et al. |
| 7,109,114 B2 | 9/2006 | Chen et al. |
| 7,115,419 B2 | 10/2006 | Suzuki |
| 7,122,222 B2 | 10/2006 | Xiao et al. |
| 7,129,185 B2 | 10/2006 | Aoyama et al. |
| 7,148,155 B1 | 12/2006 | Tarafdar et al. |
| 7,176,144 B1 | 2/2007 | Wang et al. |
| 7,183,177 B2 | 2/2007 | Al-Bayati et al. |
| 7,192,626 B2 | 3/2007 | Dussarrat et al. |
| 7,205,248 B2 | 4/2007 | Li et al. |
| 7,220,461 B2 | 5/2007 | Hasebe et al. |
| 7,297,608 B1 | 11/2007 | Papasouliotis et al. |
| 7,335,609 B2 | 2/2008 | Ingle et al. |
| 7,399,388 B2 | 7/2008 | Moghadam et al. |
| 7,419,903 B2 | 9/2008 | Haukka et al. |
| 7,435,661 B2 | 10/2008 | Miller et al. |
| 7,456,116 B2 | 11/2008 | Ingle et al. |
| 7,498,273 B2 | 3/2009 | Mallick et al. |
| 7,521,378 B2 | 4/2009 | Fucsko et al. |
| 7,524,735 B1 | 4/2009 | Gauri et al. |
| 7,524,750 B2 | 4/2009 | Nemani et al. |
| 7,541,297 B2 | 6/2009 | Mallick et al. |
| 7,745,352 B2 | 6/2010 | Mallick et al. |
| 7,749,574 B2 | 7/2010 | Mahajani et al. |
| 7,790,634 B2 | 9/2010 | Munro et al. |
| 7,803,722 B2 | 9/2010 | Liang |
| 7,825,038 B2 | 11/2010 | Ingle et al. |
| 7,825,044 B2 | 11/2010 | Mallick et al. |
| 7,867,923 B2 | 1/2011 | Mallick et al. |
| 7,902,080 B2 | 3/2011 | Chen et al. |
| 7,935,643 B2 | 5/2011 | Liang et al. |
| 7,943,531 B2 | 5/2011 | Nemani et al. |
| 7,989,365 B2 | 8/2011 | Park et al. |
| 7,994,019 B1 | 8/2011 | Kweskin et al. |
| 8,129,555 B2 | 3/2012 | Cheng et al. |
| 2001/0021595 A1 | 9/2001 | Jang |
| 2001/0029114 A1 | 10/2001 | Vulpio et al. |
| 2001/0038919 A1 | 11/2001 | Berry et al. |
| 2001/0042511 A1 * | 11/2001 | Liu et al. .................. 118/723 R |
| 2001/0048980 A1 | 12/2001 | Kishimoto et al. |
| 2001/0054387 A1 | 12/2001 | Frankel et al. |
| 2001/0055889 A1 | 12/2001 | Iyer |
| 2002/0048969 A1 | 4/2002 | Suzuki et al. |
| 2002/0068416 A1 | 6/2002 | Hsieh et al. |
| 2002/0079523 A1 | 6/2002 | Zheng et al. |
| 2002/0081817 A1 | 6/2002 | Bhakta et al. |
| 2002/0086166 A1 | 7/2002 | Hendricks et al. |
| 2002/0127350 A1 | 9/2002 | Ishikawa et al. |
| 2002/0142585 A1 | 10/2002 | Mandal |
| 2002/0146879 A1 | 10/2002 | Fu et al. |
| 2002/0164429 A1 | 11/2002 | Gaillard et al. |
| 2002/0164891 A1 | 11/2002 | Gates et al. |
| 2003/0001201 A1 | 1/2003 | Yuzuriha et al. |
| 2003/0023113 A1 | 1/2003 | Druzkowski et al. |
| 2003/0040199 A1 | 2/2003 | Agarwal |
| 2003/0064154 A1 | 4/2003 | Laxman et al. |

| | | |
|---|---|---|
| 2003/0077918 A1 | 4/2003 | Wu et al. |
| 2003/0113992 A1 | 6/2003 | Yau et al. |
| 2003/0118748 A1 | 6/2003 | Kumagai et al. |
| 2003/0124873 A1 | 7/2003 | Xing et al. |
| 2003/0143841 A1 | 7/2003 | Yang et al. |
| 2003/0159656 A1 | 8/2003 | Tan et al. |
| 2003/0172872 A1 | 9/2003 | Thakur et al. |
| 2003/0199151 A1 | 10/2003 | Ho et al. |
| 2003/0232495 A1 | 12/2003 | Moghadam et al. |
| 2004/0008334 A1 | 1/2004 | Sreenivasan et al. |
| 2004/0020601 A1 | 2/2004 | Zhao et al. |
| 2004/0029352 A1 | 2/2004 | Beyer et al. |
| 2004/0029353 A1 | 2/2004 | Zheng et al. |
| 2004/0048492 A1 | 3/2004 | Ishikawa et al. |
| 2004/0065253 A1 | 4/2004 | Pois et al. |
| 2004/0079118 A1 | 4/2004 | M'Saad et al. |
| 2004/0110354 A1 | 6/2004 | Natzle et al. |
| 2004/0139983 A1 | 7/2004 | Lakshmanan et al. |
| 2004/0146661 A1 | 7/2004 | Kapoor et al. |
| 2004/0152342 A1 | 8/2004 | Li et al. |
| 2004/0161899 A1 | 8/2004 | Luo et al. |
| 2004/0175501 A1 | 9/2004 | Lukas et al. |
| 2004/0180557 A1 | 9/2004 | Park et al. |
| 2004/0185641 A1 | 9/2004 | Tanabe et al. |
| 2004/0194706 A1 | 10/2004 | Wang et al. |
| 2004/0216844 A1 | 11/2004 | Janakiraman et al. |
| 2004/0219780 A1 | 11/2004 | Ohuchi |
| 2004/0231590 A1 | 11/2004 | Ovshinsky |
| 2004/0241342 A1 | 12/2004 | Karim et al. |
| 2005/0001556 A1 | 1/2005 | Hoffman et al. |
| 2005/0014354 A1 | 1/2005 | Ozawa et al. |
| 2005/0019494 A1 | 1/2005 | Moghadam et al. |
| 2005/0026443 A1 | 2/2005 | Goo et al. |
| 2005/0062165 A1 | 3/2005 | Saenger et al. |
| 2005/0087140 A1 | 4/2005 | Yuda et al. |
| 2005/0118794 A1 | 6/2005 | Babayan et al. |
| 2005/0142895 A1 | 6/2005 | Ingle et al. |
| 2005/0153574 A1 | 7/2005 | Mandal |
| 2005/0181555 A1 | 8/2005 | Haukka et al. |
| 2005/0186731 A1 | 8/2005 | Derderian et al. |
| 2005/0186789 A1 | 8/2005 | Agarwal |
| 2005/0196533 A1 | 9/2005 | Hasebe et al. |
| 2005/0227017 A1 | 10/2005 | Senzaki et al. |
| 2005/0227499 A1 | 10/2005 | Park et al. |
| 2005/0230350 A1 | 10/2005 | Kao et al. |
| 2005/0250340 A1 | 11/2005 | Chen et al. |
| 2005/0260347 A1 | 11/2005 | Narwankar et al. |
| 2006/0011984 A1 | 1/2006 | Curie |
| 2006/0014399 A1 | 1/2006 | Joe |
| 2006/0030151 A1 | 2/2006 | Ding et al. |
| 2006/0030165 A1 | 2/2006 | Ingle et al. |
| 2006/0046506 A1 | 3/2006 | Fukiage |
| 2006/0055004 A1 | 3/2006 | Gates et al. |
| 2006/0068599 A1 | 3/2006 | Baek et al. |
| 2006/0075966 A1 | 4/2006 | Chen et al. |
| 2006/0088985 A1 | 4/2006 | Haverkort et al. |
| 2006/0090694 A1 | 5/2006 | Cho et al. |
| 2006/0096540 A1 | 5/2006 | Choi |
| 2006/0110939 A1 | 5/2006 | Joshi et al. |
| 2006/0110943 A1 | 5/2006 | Swerts et al. |
| 2006/0121394 A1 | 6/2006 | Chi |
| 2006/0162661 A1 | 7/2006 | Jung et al. |
| 2006/0178018 A1 | 8/2006 | Olsen |
| 2006/0223315 A1 | 10/2006 | Yokota et al. |
| 2006/0228903 A1 | 10/2006 | McSwiney et al. |
| 2006/0252240 A1 | 11/2006 | Gschwandtner et al. |
| 2006/0281496 A1 | 12/2006 | Cedraeus |
| 2006/0286776 A1 | 12/2006 | Ranish et al. |
| 2007/0004170 A1 | 1/2007 | Kawasaki et al. |
| 2007/0020392 A1 | 1/2007 | Kobrin et al. |
| 2007/0026689 A1 | 2/2007 | Nakata et al. |
| 2007/0031598 A1 | 2/2007 | Okuyama et al. |
| 2007/0031609 A1 | 2/2007 | Kumar et al. |
| 2007/0032054 A1 | 2/2007 | Ramaswamy et al. |
| 2007/0049044 A1 | 3/2007 | Marsh |
| 2007/0077777 A1 | 4/2007 | Gumpher |
| 2007/0092661 A1 | 4/2007 | Ryuzaki et al. |
| 2007/0099438 A1 | 5/2007 | Ye et al. |
| 2007/0108404 A1 | 5/2007 | Stewart et al. |
| 2007/0128864 A1 | 6/2007 | Ma et al. |
| 2007/0134433 A1 | 6/2007 | Dussarrat et al. |
| 2007/0166892 A1 | 7/2007 | Hori |
| 2007/0173073 A1 | 7/2007 | Weber |
| 2007/0181966 A1 | 8/2007 | Watatani et al. |
| 2007/0232071 A1 | 10/2007 | Balseanu et al. |
| 2007/0232082 A1 | 10/2007 | Balseanu et al. |
| 2007/0275569 A1 | 11/2007 | Moghadam et al. |
| 2007/0281106 A1 | 12/2007 | Lubomirsky et al. |
| 2007/0281495 A1 | 12/2007 | Mallick et al. |
| 2007/0281496 A1* | 12/2007 | Ingle et al. .................. 438/778 |
| 2008/0000423 A1 | 1/2008 | Fukiage |
| 2008/0026597 A1 | 1/2008 | Munro et al. |
| 2008/0063809 A1 | 3/2008 | Lee et al. |
| 2008/0081104 A1 | 4/2008 | Hasebe et al. |
| 2008/0085607 A1 | 4/2008 | Yu et al. |
| 2008/0102223 A1 | 5/2008 | Wagner et al. |
| 2008/0102650 A1 | 5/2008 | Adams et al. |
| 2008/0182382 A1 | 7/2008 | Ingle et al. |
| 2008/0188087 A1 | 8/2008 | Chen et al. |
| 2008/0206954 A1 | 8/2008 | Jong-Wan et al. |
| 2008/0260969 A1 | 10/2008 | Dussarrat et al. |
| 2008/0305648 A1 | 12/2008 | Fukazawa et al. |
| 2008/0318429 A1 | 12/2008 | Ozawa et al. |
| 2009/0031953 A1 | 2/2009 | Ingle et al. |
| 2009/0035917 A1 | 2/2009 | Tae et al. |
| 2009/0053901 A1 | 2/2009 | Goto et al. |
| 2009/0061647 A1 | 3/2009 | Mallick et al. |
| 2009/0075490 A1 | 3/2009 | Dussarrat et al. |
| 2009/0095714 A1 | 4/2009 | Chen et al. |
| 2009/0104755 A1* | 4/2009 | Mallick et al. ............... 438/477 |
| 2009/0104789 A1* | 4/2009 | Mallick et al. ............... 438/788 |
| 2009/0104790 A1* | 4/2009 | Liang ........................ 438/788 |
| 2009/0104791 A1* | 4/2009 | Nemani et al. ............... 438/788 |
| 2009/0194809 A1 | 8/2009 | Cho |
| 2009/0203225 A1 | 8/2009 | Gates et al. |
| 2009/0209081 A1 | 8/2009 | Matero et al. |
| 2009/0215251 A1 | 8/2009 | Vellaikal et al. |
| 2009/0224374 A1 | 9/2009 | Bhatia et al. |
| 2009/0232985 A1 | 9/2009 | Dussarrat et al. |
| 2009/0277587 A1 | 11/2009 | Lubomirsky et al. |
| 2009/0280650 A1 | 11/2009 | Lubomirsky et al. |
| 2009/0298257 A1 | 12/2009 | Lee et al. |
| 2009/0325391 A1 | 12/2009 | De Vusser et al. |
| 2010/0081293 A1 | 4/2010 | Mallick et al. |
| 2010/0140756 A1 | 6/2010 | Kozasa et al. |
| 2010/0221428 A1 | 9/2010 | Dussarrat |
| 2010/0221925 A1 | 9/2010 | Lee et al. |
| 2011/0014798 A1 | 1/2011 | Mallick et al. |
| 2011/0034035 A1 | 2/2011 | Liang et al. |
| 2011/0034039 A1 | 2/2011 | Liang et al. |
| 2011/0045676 A1 | 2/2011 | Park et al. |
| 2011/0111137 A1* | 5/2011 | Liang et al. ................... 427/579 |
| 2011/0129616 A1 | 6/2011 | Ingle et al. |
| 2011/0136347 A1 | 6/2011 | Kovarsky et al. |
| 2011/0159213 A1 | 6/2011 | Cai et al. |
| 2011/0159703 A1 | 6/2011 | Liang et al. |
| 2011/0165347 A1 | 7/2011 | Miller et al. |
| 2011/0165781 A1 | 7/2011 | Liang et al. |
| 2011/0217851 A1 | 9/2011 | Liang et al. |
| 2011/0223774 A1 | 9/2011 | Kweskin et al. |
| 2012/0009802 A1 | 1/2012 | LaVoie et al. |
| 2012/0111831 A1 | 5/2012 | Ha |

FOREIGN PATENT DOCUMENTS

| | | |
|---|---|---|
| EP | 0892083 A1 | 1/1999 |
| EP | 1095958 B1 | 5/2001 |
| EP | 1717848 A | 2/2006 |
| JP | 01-235259 A | 9/1989 |
| JP | 01241826 A | 9/1989 |
| JP | 07-014826 A | 1/1995 |
| JP | 08-236518 A | 9/1996 |
| JP | 08-288286 A | 11/1996 |
| JP | 09-237785 A | 9/1997 |
| JP | 2008-159824 A | 7/2008 |
| KR | 10-2004-0091978 A | 11/2004 |
| KR | 1020040104533 A | 12/2004 |
| KR | 10-2005-0003758 A | 1/2005 |
| KR | 10-2005-0094183 A | 9/2005 |

| KR | 1020060081350 A | 7/2006 |
| KR | 10-2009-0011765 A | 2/2009 |
| TW | 200514163 | 4/2005 |
| TW | 200707582 | 2/2007 |
| WO | WO 02/077320 A1 | 10/2002 |
| WO | WO 03/066933 A | 8/2003 |
| WO | WO 2005/078784 A | 8/2005 |
| WO | WO 2007/040856 A2 | 4/2007 |
| WO | WO 2007/140376 A | 12/2007 |
| WO | WO 2007/140424 A | 12/2007 |

OTHER PUBLICATIONS

Gulleri, G. et al., "Deposition Temperature Determination of HDPCVD Silicon Dioxide Films," 2005, Microelectronic Engineering, vol. 82, pp. 236-241.

Kang, Hun, "A Study of the Nucleation and Formation of Multifunctional Nanostructures using GaN-Based Materials for Device Applications," Georgia Institute of Technology, Doctor of Philosophy in the School of Electrical & Computer Engineering Dissertation, Dec. 2006, p. 14.

Lee, Eun Gu, et al., "Effects of Wet Oxidation on the Electrical Properties of sub-10 nm thick silicon nitride films", Thin Solid Films, Elsevier-Sequoia S.A. Lausanne, CH. vol. 205, No. 2, Dec. 1, 1991, pp. 256-251.

Lucovsky, G. et al., "Deposition of silicon dioxide and silicon nitride by remote plasma enhanced chemical vapor deposition," Journal of Vacuum Science & Technology, vol. 4, No. 3, May-Jun. (1986), pp. 681-688.

Tsu, D. V. et al., "Silicon Nitride and Silicon Diimide Grown by Remote Plasma Enhanced Chemical Vapor Deposition", Journal of Vacuum Science and Technology: Part A, AVS/AIP, Melville, NY.; US, vol. 4, No. 3, Part 01, May 1, 1986, pp. 480-485.

Aylett, B. J. et al., "Silicon-Nitrogen Compounds. Part V. Diphenylamino-derivatives of Silane," J. Chem. Soc. (A), 1969, pp. 636-638.

Aylett, B. J. et al., "Silicon-Nitrogen Compounds. Part VI.[1] The Preparation and Properties of Disilazane," J. Chem. Soc. (A), 1969, pp. 639-642.

Aylett, B. J. et al., "The Preparation and Some Properties of Disilylamine-Correspondence," Inorganic Chemistry, 1966, p. 167.

Beach, David B., "Infrared and Mass Spectroscopic Study of the Reaction of Silyl Iodide and Ammonia. Infrared Spectrum to Silylamine," Inorganic Chemistry, 1992, pp. 4174-4177, vol. 31 No. 20.

Burg, Anton B. et al., "Silyl-Amino Boron Compounds," J. Amer. Chem. Soc., Jul. 1950, pp. 3103-3107, vol. 72.

Davison, A et al., "The Raman Spectra of Manganese and Rhenium Carbonyl Hydrides and Some Related Species," Inorganic Chemistry, Apr. 1967, pp. 845-847, vol. 6 No. 4.

Dussarrat, C. et al., "Low Pressure Chemical Vapor Deposition of Silicon Nitride Using Mono- and Disilylamine," Chemical Vapor Deposition XVI and EUROCVD 14 vol. 2 Proceedings of the International Symposium, Part of the 203rd Electrochemical Society Meeting in Paris France, Apr. 27-May 2, 2003, 11 pages.

Norman, Arlan D. et al., "Reaction of Silylphosphine with Ammonia," Inoragnic Chemistry, 1979, pp. 1594-1597, vol. 18 No. 6.

Sujishi, Sei et al., "Effect of Replacement of Carbon by Silicon in Trimethylamine on the Stabilities of the Trimethylboron Addition Compounds. Estimation of the Resonance Energy for Silicon-Nitrogen Partial Double Bond," Amer. Chem. Soc., Sep. 20, 1954, pp. 4631-4636, vol. 76.

Ward, L. G. L. et al., "The Preparation and Properties of *Bis*-Disilanyl Sulphide and *Tris*-Disilanylamine," J. Inorg. Nucl. Chem., 1961, pp. 287-293, vol. 21, Pergamon Press Ltd., Northern Ireland.

Ward, Laird G. L., "Bromosilane, Iodosilane, and Trisilylamine," Inorganic Syntheses, 1968, pp. 159- 170, vol. 11.

Zuckerman, J.J., "Inorganic Reactions and Methods," Formation of Bonds to N, P, As, Sb, Bi (Part 1), ISBN-0-89573-250-5, 1998, 5 pages, vol. 7, VCH Publishers, Inc., New York.

Alexandrov, Sergei E., et al., "Formation of Silicon Nitride Films by Remote Plasma-enhanced Chemical Vapour Deposition". Advanced Materials for Optics and Electronics, vol. 2, 301-312 (1993).

Bowen, C., et al., "New Processing Techniques: Sweeping of Quartz Wafers and a Practical Method for Processing Quartz Resonators Under Controlled Conditions," Proceedings of the 1992 IEEE Frequency Control Symposium, pp. 648-656.

International Search Report and Written Opinion of PCT/US2011/054981, mailed May 9, 2012, 10 pages.

International Search Report and Written Opinion of PCT/US2011/054984, mailed May 11, 2012, 10 pages.

Loboda, M.J., et al., "Chemical influence of inert gas on the thin film stress in plasma-enhanced chemical vapor deposited a- SiN:H films". Journal of Materials Research, vol. 11, No. 2, Feb 1996, pp. 391-398.

* cited by examiner

US 8,304,351 B2

IN-SITU OZONE CURE FOR RADICAL-COMPONENT CVD

CROSS-REFERENCES TO RELATED APPLICATIONS

This application claims the benefit of U.S. Prov. Pat. App. No. 61/293,082 filed Jan. 7, 2010, and titled "IN-SITU OZONE CURE FOR RADICAL-COMPONENT CVD," which is entirely incorporated herein by reference for all purposes.

BACKGROUND OF THE INVENTION

Semiconductor device geometries have dramatically decreased in size since their introduction several decades ago. Modern semiconductor fabrication equipment routinely produces devices with 45 nm, 32 nm, and 28 nm feature sizes, and new equipment is being developed and implemented to make devices with even smaller geometries. The decreasing feature sizes result in structural features on the device having decreased spatial dimensions. The widths of gaps and trenches on the device narrow to a point where the aspect ratio of gap depth to its width becomes high enough to make it challenging to fill the gap with dielectric material. The depositing dielectric material is prone to clog at the top before the gap completely fills, producing a void or seam in the middle of the gap.

Over the years, many techniques have been developed to avoid having dielectric material clog the top of a gap, or to "heal" the void or seam that has been formed. One approach has been to start with highly flowable precursor materials that may be applied in a liquid phase to a spinning substrate surface (e.g., SOG deposition techniques). These flowable precursors can flow into and fill very small substrate gaps without forming voids or weak seams. However, once these highly flowable materials are deposited, they have to be hardened into a solid dielectric material.

In many instances, the hardening process includes a heat treatment to remove carbon and hydroxyl groups from the deposited material to leave behind a solid dielectric such as silicon oxide. Unfortunately, the departing carbon and hydroxyl species often leave behind pores in the hardened dielectic that reduce the quality of the final material. In addition, the hardening dielectric also tends to shrink in volume, which can leave cracks and spaces at the interface of the dielectric and the surrounding substrate. In some instances, the volume of the hardened dielectric can decrease by 40% or more.

Thus, there is a need for new deposition processes and materials to form dielectric materials on structured substrates without generating voids, seams, or both, in substrate gaps and trenches. There is also a need for materials and methods of hardening flowable dielectric materials with fewer pores and a lower decrease in volume. This and other needs are addressed in the present application.

BRIEF SUMMARY OF THE INVENTION

Methods of forming a dielectric layer are described. The methods include the steps of mixing a silicon-containing precursor with a plasma effluent, and depositing a silicon-and-nitrogen-containing layer on a substrate. The silicon-and-nitrogen-containing layer is converted to a silicon-and-oxygen-containing layer by curing in an ozone-containing atmosphere in the same substrate processing region used for depositing the silicon-and-nitrogen-containing layer. Another silicon-and-nitrogen-containing layer may be deposited on the silicon-and-oxygen-containing layer and the stack of layers may again be cured in ozone all without removing the substrate from the substrate processing region. After an integral multiple of dep-cure cycles, the conversion of the stack of silicon-and-oxygen-containing layers may be annealed at a higher temperature in an oxygen-containing environment.

Embodiments of the invention include methods of forming a silicon-and-oxygen-containing layer on a substrate in a substrate processing region in a substrate processing chamber. The methods include forming a silicon-and-nitrogen-containing layer on the substrate in the substrate processing region. Forming the silicon-and-nitrogen-containing layer involves flowing a nitrogen-and-hydrogen-containing gas into a plasma region to produce a radical-nitrogen precursor, combining a carbon-free silicon-containing precursor with the radical-nitrogen precursor in the plasma-free substrate processing region, and depositing a silicon-and-nitrogen-containing layer on the substrate. The methods further include curing the silicon-and-nitrogen-containing layer in an ozone-containing atmosphere in the substrate processing region.

Additional embodiments and features are set forth in part in the description that follows, and in part will become apparent to those skilled in the art upon examination of the specification or may be learned by the practice of the invention. The features and advantages of the invention may be realized and attained by means of the instrumentalities, combinations, and methods described in the specification.

BRIEF DESCRIPTION OF THE DRAWINGS

A further understanding of the nature and advantages of the present invention may be realized by reference to the remaining portions of the specification and the drawings wherein like reference numerals are used throughout the several drawings to refer to similar components. In some instances, a sublabel is associated with a reference numeral and follows a hyphen to denote one of multiple similar components. When reference is made to a reference numeral without specification to an existing sublabel, it is intended to refer to all such multiple similar components.

DETAILED DESCRIPTION OF THE INVENTION

Methods of forming a dielectric layer are described. The methods include the steps of mixing a silicon-containing precursor with a plasma effluent, and depositing a silicon-and-nitrogen-containing layer on a substrate. The silicon-and-nitrogen-containing layer is converted to a silicon-and-oxygen-containing layer by curing an ozone-containing atmosphere in the same substrate processing region used for depositing the silicon-and-nitrogen-containing layer. Another silicon-and-nitrogen-containing layer may be deposited on the silicon-and-oxygen-containing layer and the stack of layers may again be cured in ozone all without removing the substrate from the substrate processing region. After an integral multiple of dep-cure cycles, the conversion of the stack of silicon-and-oxygen-containing layers may be annealed at a higher temperature in an oxygen-containing environment.

Without binding the coverage of the claims to hypothetical mechanisms which may or may not be entirely correct, a discussion of some details may prove beneficial. Exposing an as-deposited silicon-and-nitrogen-containing film to ozone while maintaining a relatively low substrate temperature increases the oxygen content over only annealing the substrate at a relatively high substrate temperature in an oxygen-containing environment. This may result from the relatively open network produced by the deposition of the silicon-and-nitrogen film by mixing a radical-nitrogen precursor with an carbon-free silicon-and-nitrogen-containing precursor. The open network may allow the ozone to penetrate more deeply within the film, extending the oxide conversion in the direction of the substrate. Performing the conversion at high temperature may close the network near the surface thereby limiting the physical extent of the conversion.

The reactivity of ozone lies between that of molecular oxygen and atomic oxygen. Molecular oxygen requires a higher temperature to activate the oxidation which results in a closure of the open silicon-and-nitrogen network near the surface. This closure undesirably limits the oxidation in deeper portions of the silicon-and-nitrogen-containing layer. Atomic oxygen would react too readily at low temperatures and close the network as well. Ozone is found to offer the stability to penetrate deep into the open network while not requiring a high temperature to promote the oxidation. Additional details about the methods and systems of forming the silicon oxide layer will now be described.

In light of the theorized ability of ozone to supplant hydrogen and nitrogen, it appeared possible to conduct the ozone cure with little or no heating enabling the ozone cure to occur within the deposition region. Additional details about the methods and system of forming silicon oxide using an integrated ozone-cure will now be described.

Exemplary Silicon Oxide Formation Process

Figure 1:
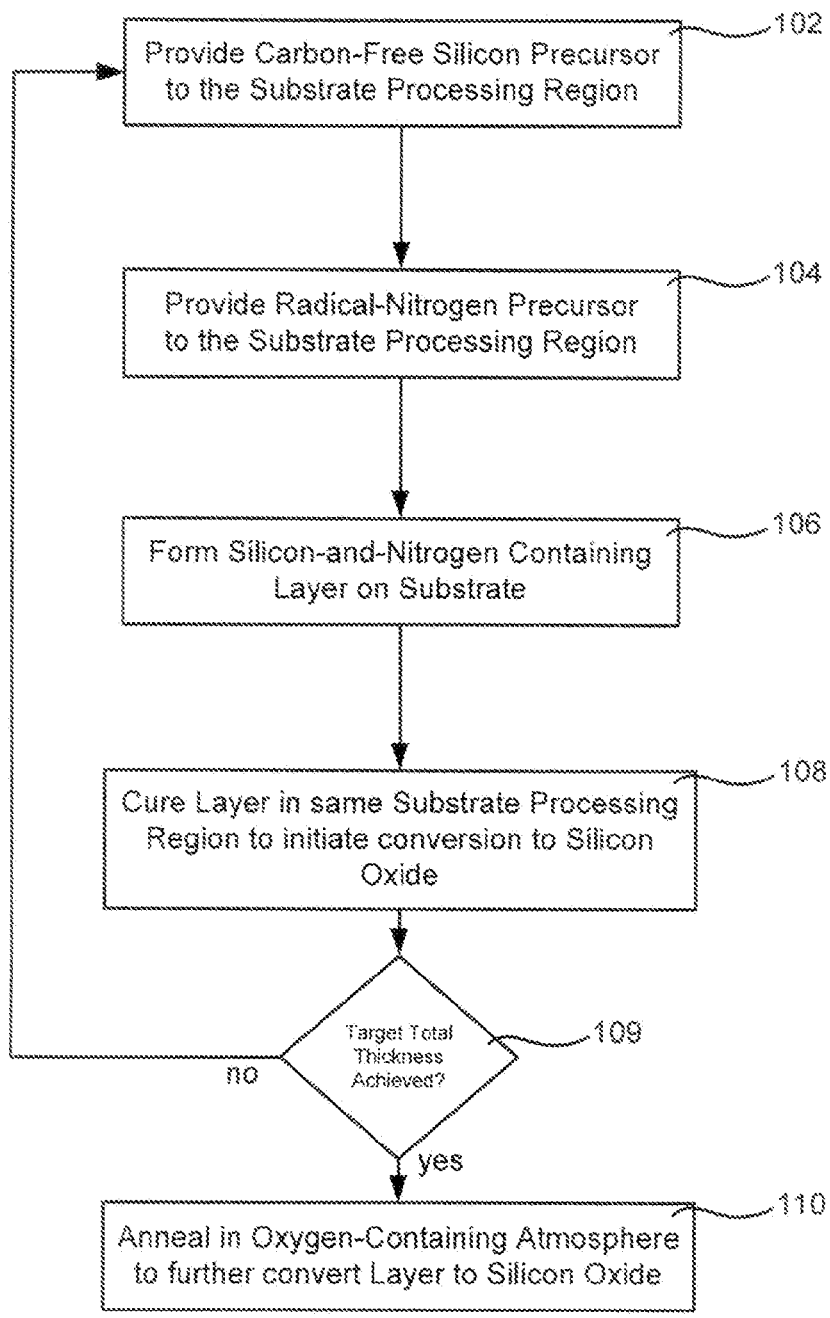
FIG. 1 is a flowchart illustrating selected steps for making a silicon oxide film according to embodiments of the invention.

FIG. 1 is a flowchart showing selected steps in methods 100 of making silicon oxide films according to embodiments of the invention. The method 100 includes providing a carbon-free silicon precursor to a substrate processing region 102. The carbon-free silicon precursor may be, for example, a silicon-and-nitrogen precursor, a silicon-and-hydrogen precursor, or a silicon-nitrogen-and-hydrogen-containing precursor, among other classes of silicon precursors. The silicon-precursor may be oxygen-free in addition to carbon-free. The lack of oxygen results in a lower concentration of silanol (Si—OH) groups in the silicon-and-nitrogen layer formed from the precursors. Excess silanol moieties in the deposited film can cause increased porosity and shrinkage during post deposition steps that remove the hydroxyl (—OH) moieties from the deposited layer.

Specific examples of carbon-free silicon precursors may include silyl-amines such as $H_2N(SiH_3)$, $HN(SiH_3)_2$, and $N(SiH_3)_3$, among other silyl-amines. The flow rates of a silyl-amine may be greater than or about 200 sccm, greater than or about 300 sccm or greater than or about 500 sccm in different embodiments. All flow rates given herein refer to a dual chamber substrate processing system. Single wafer systems would require half these flow rates and other wafer sizes would require flow rates scaled by the processed area. These silyl-amines may be mixed with additional gases that may act as carrier gases, reactive gases, or both. Examples of the additional gases may include $H_2$, $N_2$, $NH_3$, He, and Ar, among other gases. Examples of carbon-free silicon precursors may also include silane ($SiH_4$) either alone or mixed with other silicon (e.g., $N(SiH_3)_3$), hydrogen (e.g., $H_2$), and/or nitrogen (e.g., $N_2$, $NH_3$) containing gases. Carbon-free silicon precursors may also include disilane, trisilane, even higher-order silanes, and chlorinated silanes, alone or in combination with one another or the previously mentioned carbon-free silicon precursors. Generally speaking silicon precursors which include carbon may also be used with the caveat that the films may shrink more than when carbon-free silicon precursors are used.

A radical-nitrogen precursor may also be provided to the substrate processing region 104. The radical-nitrogen precursor is a nitrogen-radical-containing precursor that was generated outside the substrate processing region from a more stable nitrogen precursor. For example, a stable nitrogen precursor compound containing $NH_3$, $H_2$ and/or $N_2$ may be activated in a chamber plasma region or a remote plasma system (RPS) outside the processing chamber to form the radical-nitrogen precursor, which is then transported into the substrate processing region. The flow rate of the stable nitrogen precursor may be greater than or about 300 sccm, greater than or about 500 sccm or greater than or about 700 sccm in different embodiments. The radical-nitrogen precursor produced in the chamber plasma region may be one or more of .N, .NH, .$NH_2$, etc., and may also be accompanied by ionized species formed in the plasma.

Generally speaking, other radical precursors may be used to create silicon-and-nitrogen-containing layers. The radical precursors may or may not include nitrogen. If no nitrogen is present in the radical precursor, nitrogen will be supplied by the silicon-containing precursor. Nitrogen may be present in both, in embodiments of the invention. As a result of this flexibility, a radical precursor may be more generally referred to as plasma effluents. Similarly, the stable nitrogen precursor flowed into the plasma region to create the plasma effluents may be generally referred to herein as a stable gas (since nitrogen may or may not be present).

In embodiments employing a chamber plasma region, the radical-nitrogen precursor is generated in a section of the substrate processing region partitioned from a deposition region where the precursors mix and react to deposit the silicon-and-nitrogen layer on a deposition substrate (e.g., a semiconductor wafer). The radical-nitrogen precursor may also be accompanied by a carrier gas such as hydrogen ($H_2$), nitrogen ($N_2$), helium, etc. The substrate processing region may be described herein as "plasma-free" during the growth of the silicon-and-nitrogen-containing layer and during the low temperature ozone cure. "Plasma-free" does not necessarily mean the region is devoid of plasma. The borders of the plasma in the chamber plasma region are hard to define and may encroach upon the substrate processing region through the apertures in the showerhead. In the case of inductively-coupled plasma, a small amount of ionization may be effected within the substrate processing region directly. Furthermore, a low intensity plasma may be created in the substrate processing region without eliminating the flowable nature of the forming film. All causes for a plasma having much lower intensity ion density than the chamber plasma region during the creation of the radical nitrogen precursor do not deviate from the scope of "plasma-free" as used herein.

In the substrate processing region, the carbon-free silicon precursor and the radical-nitrogen precursor mix and react to deposit a silicon-and-nitrogen-containing film on the deposition substrate 106. The deposited silicon-and-nitrogen-containing film may deposit conformally with some recipe combinations in embodiments. In other embodiments, the deposited silicon-and-nitrogen-containing film has flowable characteristics unlike conventional silicon nitride ($Si_3N_4$) film deposition techniques. The flowable nature of the formation allows the film to flow into narrow gaps trenches and other structures on the deposition surface of the substrate. Generally speaking, higher radical-nitrogen fluxes result in conformal deposition while lower fluxes result in a flowable deposition.

The flowability may be due to a variety of properties which result from mixing a radical-nitrogen precursors with carbon-free silicon precursor. These properties may include a significant hydrogen component in the deposited film and/or the presence of short chained polysilazane polymers. These short chains grow and network to form more dense dielectric material during and after the formation of the film. For example the deposited film may have a silazane-type, Si—NH—Si backbone (i.e., a Si—N—H film). When both the silicon precursor and the radical-nitrogen precursor are carbon-free, the deposited silicon-and-nitrogen-containing film is also substantially carbon-free. Of course, "carbon-free" does not necessarily mean the film lacks even trace amounts of carbon. Carbon contaminants may be present in the precursor materials that find their way into the deposited silicon-and-nitrogen precursor. The amount of these carbon impurities however are much less than would be found in a silicon precursor having a carbon moiety (e.g., TEOS, TMDSO, etc.).

Following the deposition of the silicon-and-nitrogen-containing layer, the deposition substrate may be cured in an ozone-containing atmosphere 108. The post-deposition substrate remains in the same substrate processing region for curing. The curing temperature of the substrate may be about the same as the temperature of the substrate during formation of the silicon-and-nitrogen-containing film in order to maintain throughput. Alternatively, the temperature may be elevated during the curing operation by raising the substrate closer to a heated faceplate or showerhead. The temperature of the substrate during the curing operation may be less than 120° C., less than 100° C., less than 90° C., less than 80° C. or less than 70° C. in different embodiments. The temperature of the substrate may be greater than the substrate temperature during deposition, greater than 50° C., greater than 60° C., greater than 70° C. or greater than 80° C. in different embodiments. Any of the upper bounds may be combined with any of the lower bounds to form additional ranges for the substrate temperature according to additional disclosed embodiments.

The substrate processing region may be plasma-free during the curing operation in order to avoid creating a relatively high concentration of atomic oxygen. A presence of atomic oxygen may prematurely close the relatively open network of the silicon-and-nitrogen-containing layer. No plasma is present in the substrate processing region, in embodiments, to avoid generating atomic oxygen which may close the near surface network and thwart subsurface oxidation. The flow rate of the ozone into the substrate processing region during the cure step may be greater than or about 200 sccm, greater than or about 300 sccm or greater than or about 500 sccm. The partial pressure of ozone during the cure step may be greater than or about 10 Torr, greater than or about 20 Torr or greater than or about 40 Torr. Under some conditions (e.g. between substrate temperatures from about 100° C. to about 200° C.) the conversion has been found to be substantially complete so a relatively high temperature anneal in an oxygen-containing environment may be unnecessary in embodiments.

Performing the curing operation in the same substrate processing region makes multiple dep-cure cycles possible, reducing the thickness required during each cycle. In this embodiment, the curing operation only needs to convert a reduced thickness of silicon-and-nitrogen-containing layer. This relaxes the requirements on the ozone-containing environment, allows greater concentration of atomic oxygen and widens the substrate temperature process window. A plasma is present during the curing portion of the dep-cure cycle in some embodiments. In other embodiments, no plasma is present in the substrate processing region and the ozone-containing environment contains only a small concentration of atomic oxygen. The thickness of the layer of silicon-and-nitrogen-containing layer before curing may be below 1500Å, below 1000Å, below 750Å or below 500Å in different embodiments. The thickness of the stack of all silicon-and-oxygen-containing layers combined resulting from multiple dep-cure cycles may be between 400Å and 10,000Å, in embodiments, depending primarily on the application.

A decision is made 109 as to whether the target total thickness has been reached. If the target has not been reached, another deposition operation (102-106) and another curing operation (108) are completed in sequence before the thickness of the silicon-and-oxygen-containing film is again compared to the target thickness. Once the target is reached, the substrate may remain or be removed from the substrate processing chamber and transferred to an annealing chamber for further conversion to silicon oxide.

Following an integral number of dep-cure cycles, the deposition substrate may be annealed in an oxygen-containing atmosphere 110. The deposition substrate may remain in the same substrate processing region used for curing when the oxygen-containing atmosphere is introduced, or the substrate may be transferred to a different chamber where the oxygen-containing atmosphere is introduced. The oxygen-containing atmosphere may include one or more oxygen-containing gases such as molecular oxygen ($O_2$), ozone ($O_3$), water vapor ($H_2O$), hydrogen peroxide ($H_2O_2$) and nitrogen-oxides (NO, $NO_2$, etc.), among other oxygen-containing gases. The oxygen-containing atmosphere may also include radical oxygen and hydroxyl species such as atomic oxygen (O), hydroxides (OH), etc., that may be generated remotely and transported into the substrate chamber. Ions of oxygen-containing species may also be present. The oxygen anneal temperature of the substrate may be less than or about 1100° C., less than or about 1000° C., less than or about 900° C. or less than or about 800° C. in different embodiments. The temperature of the substrate may be greater than or about 500° C., greater than or about 600° C., greater than or about 700° C. or greater than or about 800° C. in different embodiments. Once again, any of the upper bounds may be combined with any of the lower bounds to form additional ranges for the substrate temperature according to additional disclosed embodiments.

A plasma may or may not be present in the substrate processing region during the oxygen anneal. The oxygen-containing gas entering the CVD chamber may include one or more compounds that have been activated (e.g., radicalized, ionized, etc.) before entering the substrate processing region. For example, the oxygen-containing gas may include radical oxygen species, radical hydroxyl species, etc., activated by exposing more stable precursor compounds through a remote plasma source or through a chamber plasma region separated from the substrate processing region by a showerhead. The more stable precursors may include water vapor and hydrogen peroxide ($H_2O_2$) that produce hydroxyl (OH) radicals and ions, and molecular oxygen and/or ozone that produce atomic oxygen (O) radicals and ions.

The oxygen-containing atmospheres of both the curing and oxygen anneal provide oxygen to convert the silicon-and-nitrogen-containing film into the silicon oxide ($SiO_2$) film. As noted previously, the lack of carbon in the silicon-and-nitrogen-containing film results in significantly fewer pores formed in the final silicon oxide film. It also results in less volume reduction (i.e., shrinkage) of the film during the conversion to the silicon oxide. For example, where a silicon-nitrogen-carbon layer formed from carbon-containing silicon precursors may shrink by 40 vol. % or more when converted to silicon oxide, the substantially carbon-free silicon-and-nitrogen films may shrink by about 15 vol. % or less.

Figure 2:
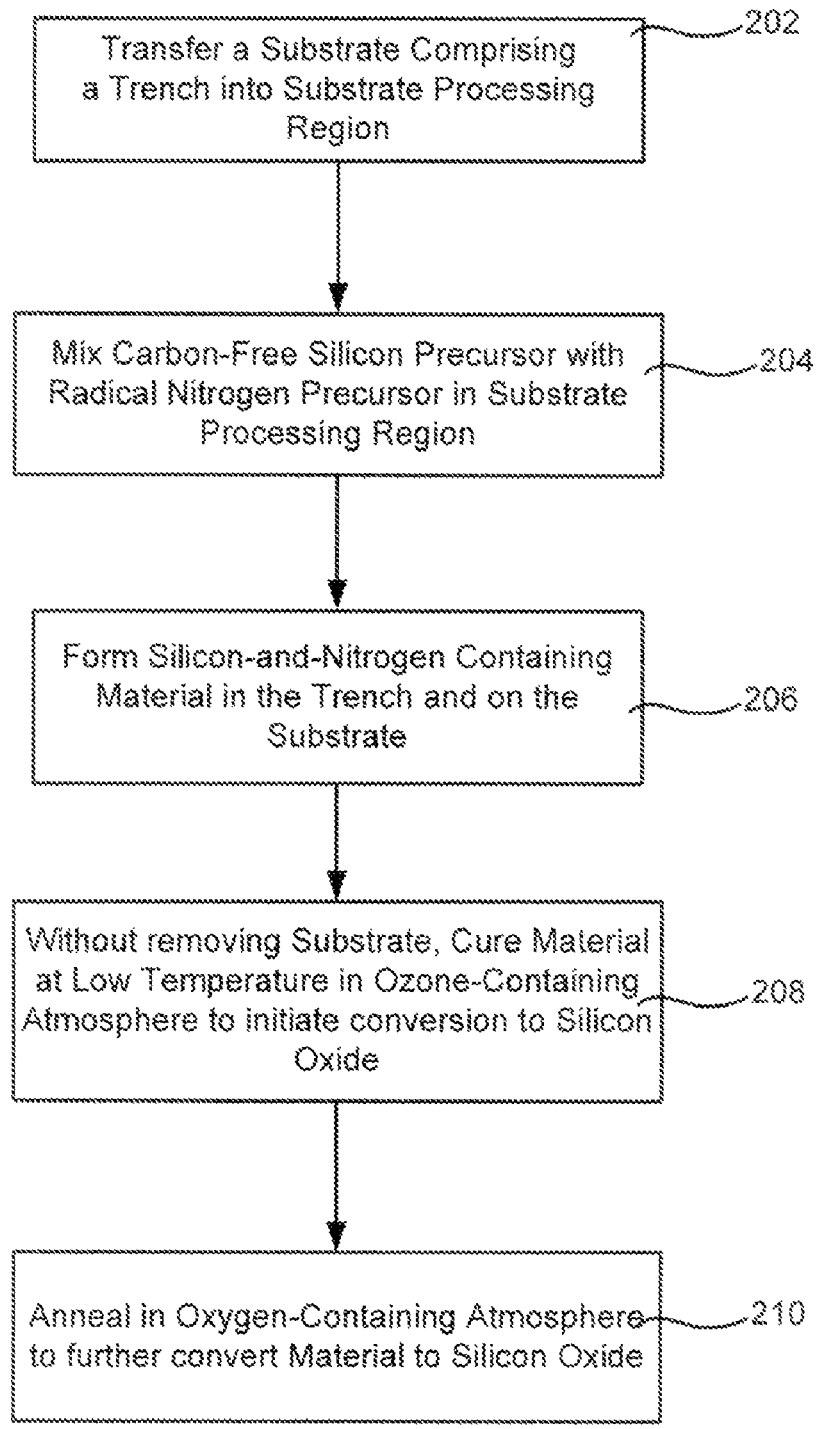
FIG. 2 is another flowchart illustrating selected steps for forming a silicon oxide film in a substrate gap according to embodiments of the invention.

Referring now to FIG. 2, another flowchart is shown illustrating selected steps in methods 200 for forming a silicon oxide film in a substrate gap according to embodiments of the invention. The method 200 may include transferring a substrate comprising a gap into a substrate processing region (operation 202). The substrate may have a plurality of gaps for the spacing and structure of device components (e.g., transistors) formed on the substrate. The gaps may have a height and width that define an aspect ratio (AR) of the height to the width (i.e., H/W) that is significantly greater than 1:1 (e.g., 5:1 or more, 6:1 or more, 7:1 or more, 8:1 or more, 9:1 or more, 10:1 or more, 11:1 or more, 12:1 or more, etc.). In many instances the high AR is due to small gap widths of that range from about 90 nm to about 22 nm or less (e.g., about 90 nm or less, 65 nm or less, 45 nm or less, 32 nm or less, 28 nm or less, 22 nm or less, 16 nm or less, etc.).

A carbon-free silicon precursor is mixed with a radical nitrogen precursor in the substrate processing region (operation 204). A flowable silicon-and-nitrogen-containing layer may be deposited on the substrate (operation 206). Because the layer is flowable, it can fill gaps with high aspect ratios without creating voids or weak seams around the center of the filling material. For example, a depositing flowable material is less likely to prematurely clog the top of a gap before it is completely filled to leave a void in the middle of the gap.

The as-deposited silicon-and-nitrogen-containing layer may then be cured (operation 208) in the same substrate processing region used for the deposition conducted in operations 204-206. In the pictured embodiment, multiple dep-cure cycles are not shown but may be conducted in analogous fashion to the repetition shown and described with reference to FIG. 1. If conversion is incomplete, the partially converted silicon-and-oxygen-containing layer is annealed in an oxygen-containing atmosphere (operation 210) to transition the silicon-and-nitrogen-containing layer to silicon oxide. A further anneal (not shown) may be carried out in an inert environment at a higher substrate temperature in order to densify the silicon oxide layer.

Curing and annealing the as-deposited silicon-and-nitrogen-containing layer in an oxygen-containing atmosphere forms a silicon oxide layer on the substrate, including the substrate gap 208. In embodiments, the processing parameters of operations 208 and 210 possess the same ranges described with reference to operations 108 and 110 of FIG. 1. As noted above, the silicon oxide layer has fewer pores and less volume reduction than similar layers formed with carbon-containing precursors that have significant quantities of carbon present in the layer before the heat treatment step. In many cases, the volume reduction is slight enough (e.g., about 15 vol. % or less) to avoid post heat treatment steps to fill, heal, or otherwise eliminate spaces that form in the gap as a result of the shrinking silicon oxide.

Figure 3:
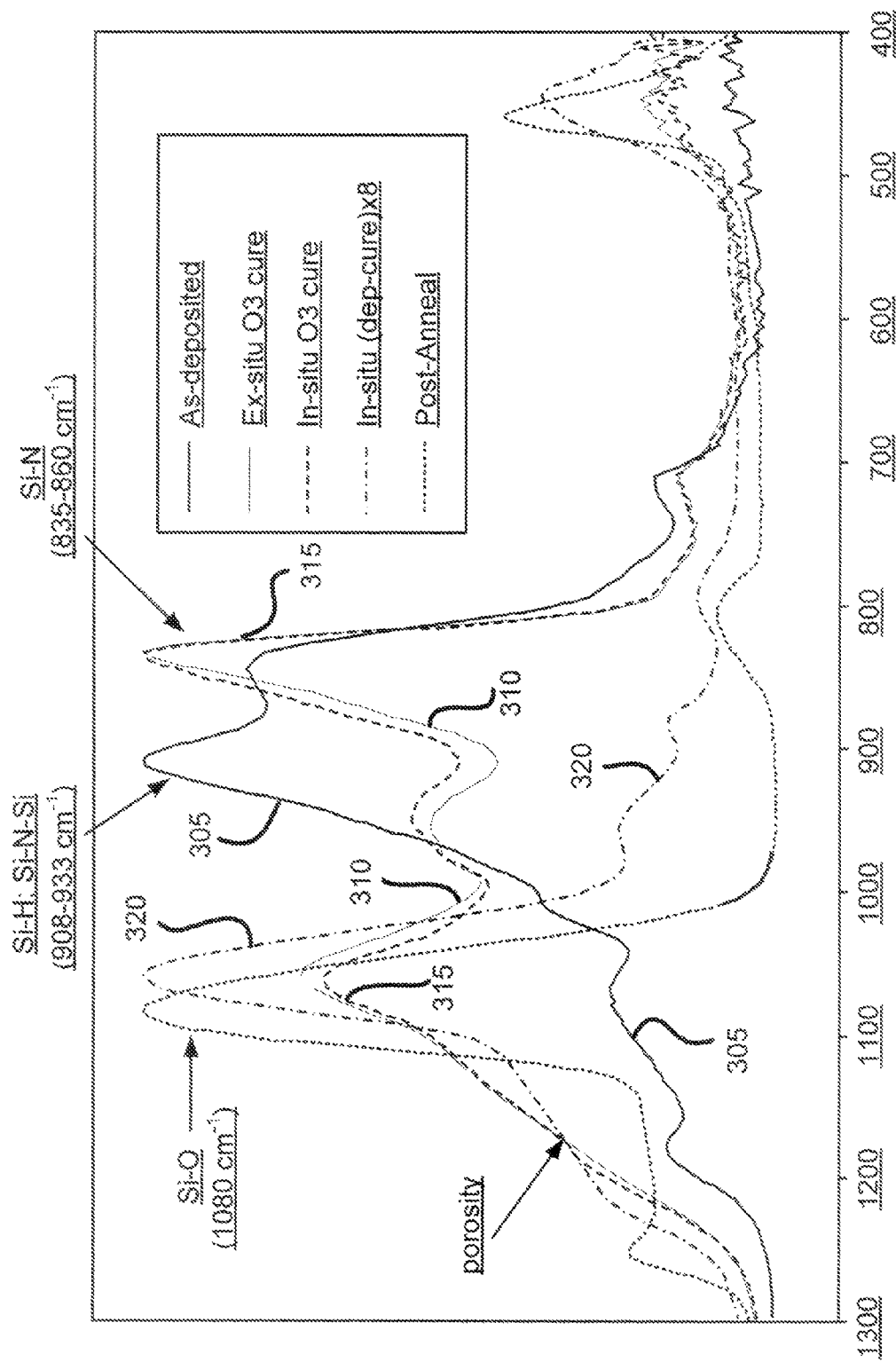
FIG. 3 is a graph of FTIR spectra acquired from silicon-containing films according to embodiments of the invention.

FIG. 3 is a graph of FTIR spectra acquired from silicon-containing films according to embodiments of the invention. The as-deposited silicon-and-nitrogen-containing film 305 shows a strong peak near 908 cm−1-933 cm−1 and a strong peak near 835 cm−1-860 cm−1 indicative of a presence of hydrogen and nitrogen. FTIR spectra are also shown for silicon-and-nitrogen-containing films cured in ozone outside 310 and inside the substrate processing region 315. In both cases, the peak associated with hydrogen is reduced similarly and other peaks match closely as well. This indicates that the lower temperature curing of the in-situ cure is similarly effective to curing in a dedicated chamber. An FTIR spectrum is also shown 320 for silicon oxide processed in 8 dep-cure cycles which indicates very little hydrogen and nitrogen remain in the film. The FTIR spectrum associated with multiple dep-cure cycles also shows a very strong oxygen peak near 1100 cm−1 indicating nice conversion of Si—H—N to silicon oxide.

Exemplary Silicon Oxide Deposition System

Deposition chambers that may implement embodiments of the present invention may include high-density plasma chemical vapor deposition (HDP-CVD) chambers, plasma enhanced chemical vapor deposition (PECVD) chambers, sub-atmospheric chemical vapor deposition (SACVD) chambers, and thermal chemical vapor deposition chambers, among other types of chambers. Specific examples of CVD systems that may implement embodiments of the invention include the CENTURA ULTIMA® HDP-CVD chambers/systems, and PRODUCER® PECVD chambers/systems, available from Applied Materials, Inc. of Santa Clara, Calif.

Examples of substrate processing chambers that can be used with exemplary methods of the invention may include those shown and described in co-assigned U.S. Provisional Patent App. No. 60/803,499 to Lubomirsky et al, filed May 30, 2006, and titled "PROCESS CHAMBER FOR DIELECTRIC GAPFILL," the entire contents of which is herein incorporated by reference for all purposes. Additional exemplary systems may include those shown and described in U.S. Pat. Nos. 6,387,207 and 6,830,624, which are also incorporated herein by reference for all purposes.

Figure 4:
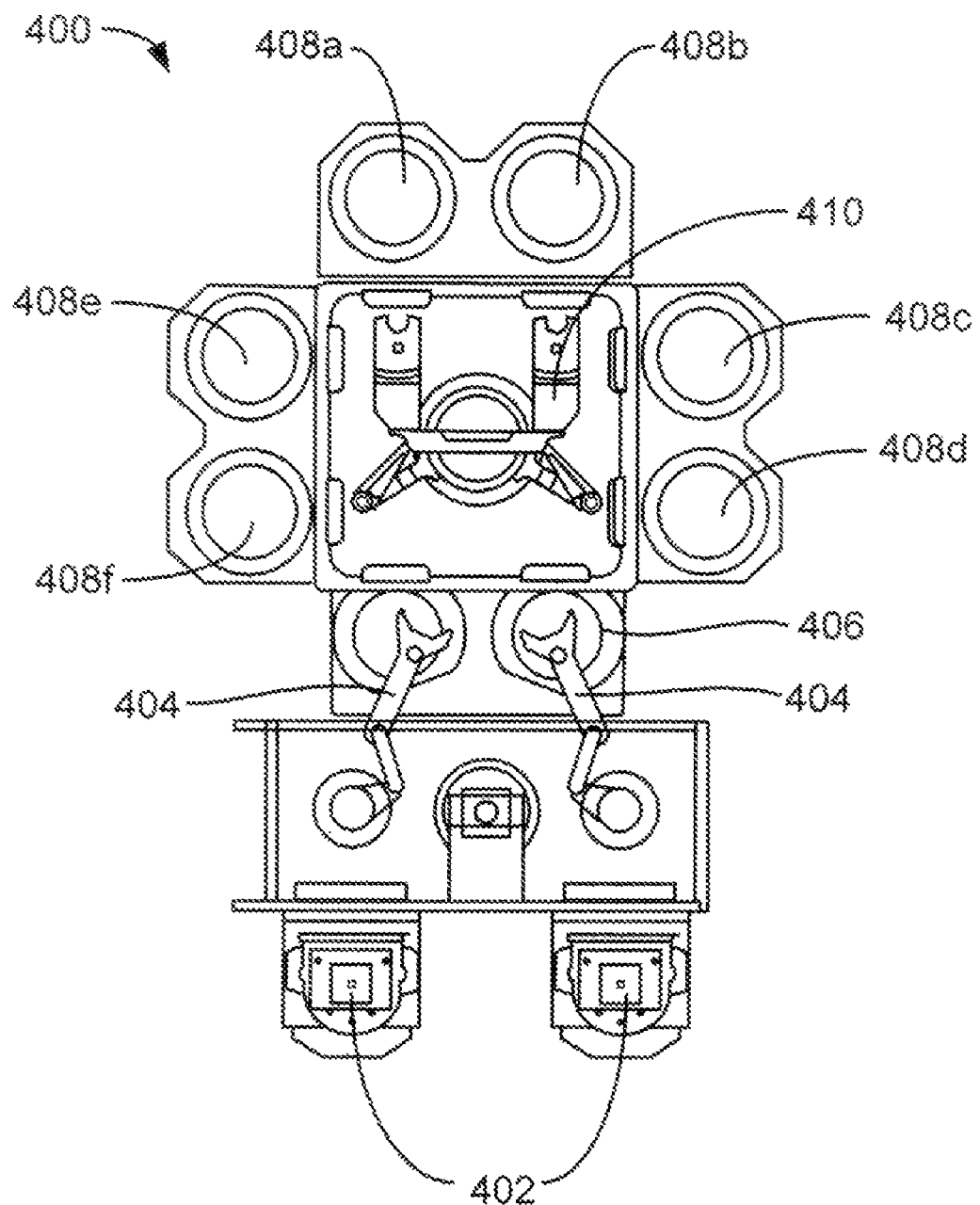
FIG. 4 shows a substrate processing system according to embodiments of the invention.

Embodiments of the deposition systems may be incorporated into larger fabrication systems for producing integrated circuit chips. FIG. 4 shows one such system 400 of deposition, baking and curing chambers according to disclosed embodiments. In the figure, a pair of FOUPs (front opening unified pods) 402 supply substrate substrates (e.g., 300 mm diameter wafers) that are received by robotic arms 404 and placed into a low pressure holding area 406 before being placed into one of the wafer processing chambers 408a-f. A second robotic arm 410 may be used to transport the substrate wafers from the holding area 406 to the processing chambers 408a-f and back.

The processing chambers 408a-f may include one or more system components for depositing, annealing, curing and/or etching a flowable dielectric film on the substrate wafer. In one configuration, two pairs of the processing chamber (e.g., 408c-d and 408e-f) may be used to deposit the flowable dielectric material on the substrate, and the third pair of processing chambers (e.g., 408a-b) may be used to anneal the deposited dielectic. In another configuration, the same two pairs of processing chambers (e.g., 408c-d and 408e-f) may be configured to both deposit and anneal a flowable dielectric film on the substrate, while the third pair of chambers (e.g., 408a-b) may be used for UV or E-beam curing of the deposited film. In still another configuration, all three pairs of chambers (e.g., 408a-f) may be configured to deposit and cure a flowable dielectric film on the substrate and each may be configured with lift pins for raising the substrate towards a heated showerhead, thus raising the temperature in an "integrated" curing operation. In yet another configuration, two pairs of processing chambers (e.g., 408*c-d* and 408*e-f*) may be used for both deposition and UV or E-beam curing of the flowable dielectric, while a third pair of processing chambers (e.g. 408*a-b*) may be used for annealing the dielectric film. Any one or more of the processes described may be carried out on chamber(s) separated from the fabrication system shown in different embodiments.

In addition, one or more of the process chambers 408*a-f* may be configured as a wet treatment chamber. These process chambers include heating the flowable dielectric film in an atmosphere that include moisture. Thus, embodiments of system 400 may include wet treatment chambers 408*a-b* and anneal processing chambers 408*c-d* to perform both wet and dry anneals on the deposited dielectric film.

Figure 5A:
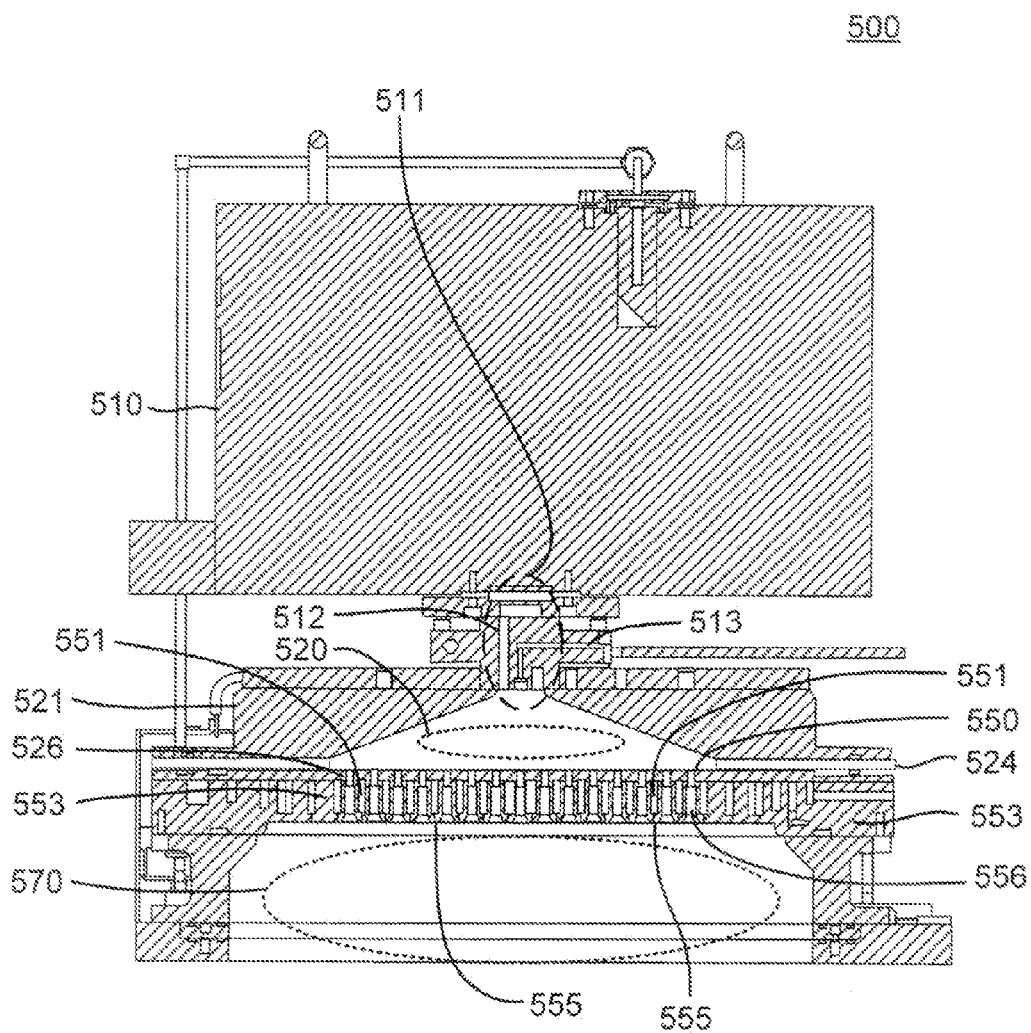
FIG. 5A shows a substrate processing chamber according to embodiments of the invention.

FIG. 5A is a substrate processing chamber 500 according to disclosed embodiments.

A remote plasma system (RPS) 510 may process a gas which then travels through a gas inlet assembly 511. Two distinct gas supply channels are visible within the gas inlet assembly 511. A first channel 512 carries a gas that passes through the remote plasma system RPS 510, while a second channel 513 bypasses the RPS 500. The first channel 512 may be used for the process gas and the second channel 513 may be used for a treatment gas in disclosed embodiments. The lid (or conductive top portion) 521 and a perforated partition 553 are shown with an insulating ring 524 in between, which allows an AC potential to be applied to the lid 521 relative to perforated partition 553. The process gas travels through first channel 512 into chamber plasma region 520 and may be excited by a plasma in chamber plasma region 520 alone or in combination with RPS 510. The combination of chamber plasma region 520 and/or RPS 510 may be referred to as a remote plasma system herein. The perforated partition (also referred to as a showerhead) 553 separates chamber plasma region 520 from a substrate processing region 570 beneath showerhead 553. Showerhead 553 allows a plasma present in chamber plasma region 520 to avoid directly exciting gases in substrate processing region 570, while still allowing excited species to travel from chamber plasma region 520 into substrate processing region 570.

Showerhead 553 is positioned between chamber plasma region 520 and substrate processing region 570 and allows plasma effluents (excited derivatives of precursors or other gases) created within chamber plasma region 520 to pass through a plurality of through holes 556 that traverse the thickness of the plate. The showerhead 553 also has one or more hollow volumes 551 which can be filled with a precursor in the form of a vapor or gas (such as a silicon-containing precursor) and pass through small holes 555 into substrate processing region 570 but not directly into chamber plasma region 520. Showerhead 553 is thicker than the length of the smallest diameter 550 of the through-holes 556 in this disclosed embodiment. In order to maintain a significant concentration of excited species penetrating from chamber plasma region 520 to substrate processing region 570, the length 526 of the smallest diameter 550 of the through-holes may be restricted by forming larger diameter portions of through-holes 556 part way through the showerhead 553. The length of the smallest diameter 550 of the through-holes 556 may be the same order of magnitude as the smallest diameter of the through-holes 556 or less in disclosed embodiments.

In the embodiment shown, showerhead 553 may distribute (via through holes 556) process gases which contain oxygen, hydrogen and/or nitrogen and/or plasma effluents of such process gases upon excitation by a plasma in chamber plasma region 520. In embodiments, the process gas introduced into the RPS 510 and/or chamber plasma region 520 through first channel 512 may contain one or more of oxygen ($O_2$), ozone ($O_3$), $N_2O$, NO, $NO_2$, $NH_3$, $N_xH_y$ including $N_2H_4$, silane, disilane, TSA and DSA. The process gas may also include a carrier gas such as helium, argon, nitrogen ($N_2$), etc. The second channel 513 may also deliver a process gas and/or a carrier gas, and/or a film-curing gas used to remove an unwanted component from the growing or as-deposited film. Plasma effluents may include ionized or neutral derivatives of the process gas and may also be referred to herein as a radical-oxygen precursor and/or a radical-nitrogen precursor referring to the atomic constituents of the process gas introduced. Showerhead 553 may be heated directly (resistively or using a thermal transfer fluid passed through an embedded channel) or indirectly from a plasma in chamber plasma region 520. Either way, the substrate temperature may be raised during an integrated cure step by raising the substrate closer to heated showerhead 553 and then lowering it once the curing operation is complete.

In embodiments, the number of through-holes 556 may be between about 60 and about 2000. Through-holes 556 may have a variety of shapes but are most easily made round. The smallest diameter 550 of through holes 556 may be between about 0.5 mm and about 20 mm or between about 1 mm and about 6 mm in disclosed embodiments. There is also latitude in choosing the cross-sectional shape of through-holes, which may be made conical, cylindrical or a combination of the two shapes. The number of small holes 555 used to introduce a gas into substrate processing region 570 may be between about 100 and about 5000 or between about 500 and about 2000 in different embodiments. The diameter of the small holes 555 may be between about 0.1 mm and about 2 mm.

Figure 5B:
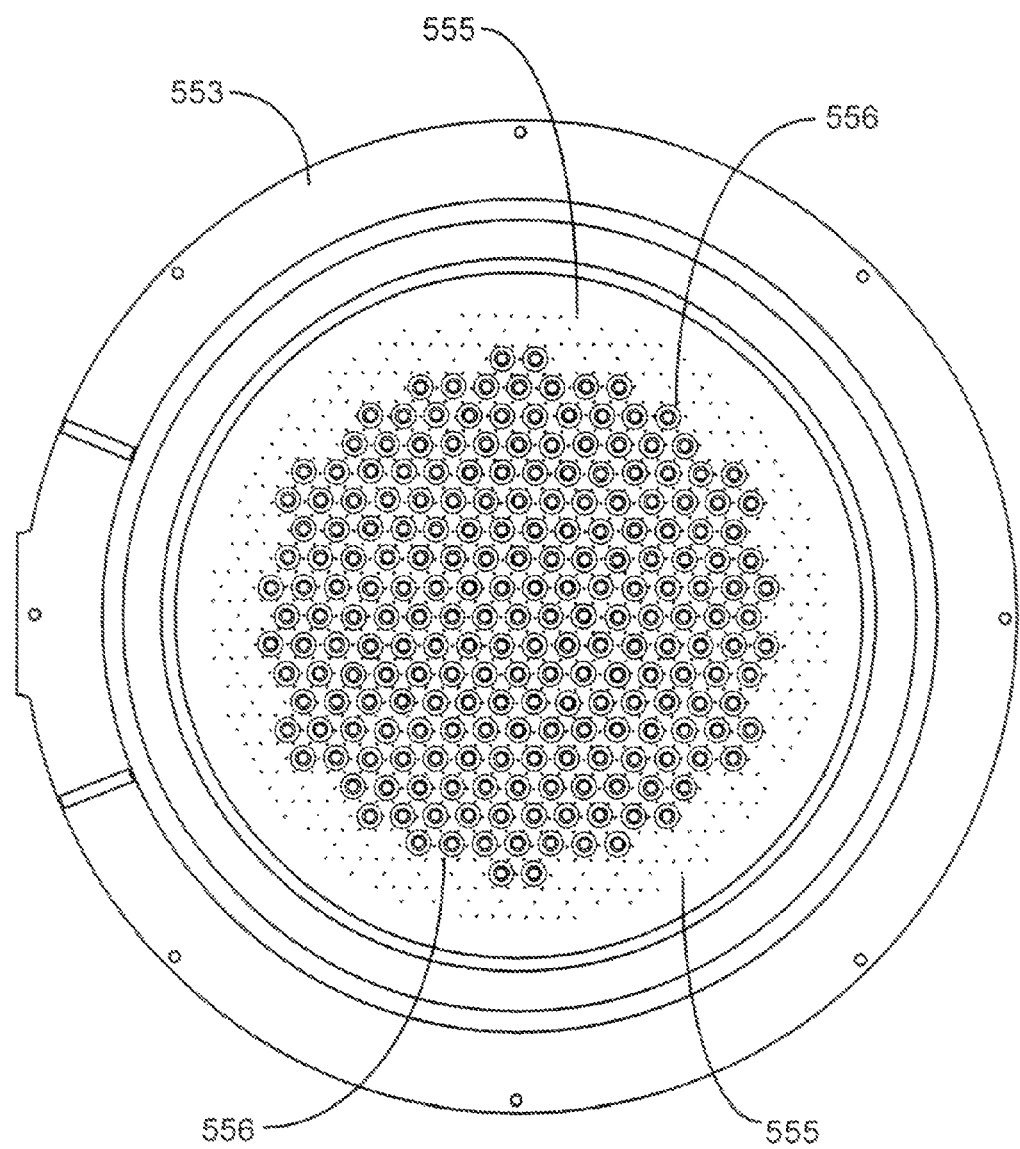
FIG. 5B shows a showerhead of a substrate processing chamber according to embodiments of the invention.

FIG. 5B is a bottom view of a showerhead 553 for use with a processing chamber according to disclosed embodiments. Showerhead 553 corresponds with the showerhead shown in FIG. 5A. Through-holes 556 are depicted with a larger inner-diameter (ID) on the bottom of showerhead 553 and a smaller ID at the top. Small holes 555 are distributed substantially evenly over the surface of the showerhead, even amongst the through-holes 556 which helps to provide more even mixing.

An exemplary film is created on a substrate supported by a pedestal (not shown) within substrate processing region 570 when plasma effluents arriving through through-holes 556 in showerhead 553 combine with a silicon-containing precursor arriving through the small holes 555 originating from hollow volumes 551. Though substrate processing region 570 may be equipped to support a plasma for other processes such as curing, no plasma is present during the growth of the exemplary film.

A plasma may be ignited either in chamber plasma region 520 above showerhead 553 or substrate processing region 570 below showerhead 553. A plasma is present in chamber plasma region 520 to produce the radical nitrogen precursor from an inflow of a nitrogen-and-hydrogen-containing gas. An AC voltage typically in the radio frequency (RF) range is applied between the conductive top portion 521 of the processing chamber and showerhead 553 to ignite a plasma in chamber plasma region 520 during deposition. An RF power supply generates a high RF frequency of 13.56 MHz but may also generate other frequencies alone or in combination with the 13.56 MHz frequency.

The top plasma may be left at low or no power when the bottom plasma in the substrate processing region 570 is turned on to either cure a film or clean the interior surfaces bordering substrate processing region 570. A plasma in substrate processing region 570 is ignited by applying an AC voltage between showerhead 553 and the pedestal or bottom of the chamber. A cleaning gas may be introduced into substrate processing region 570 while the plasma is present.

The pedestal may have a heat exchange channel through which a heat exchange fluid flows to control the temperature of the substrate. This configuration allows the substrate temperature to be cooled or heated to maintain relatively low temperatures (from room temperature through about 120° C.). The heat exchange fluid may comprise ethylene glycol and water. The wafer support platter of the pedestal (preferably aluminum, ceramic, or a combination thereof) may also be resistively heated in order to achieve relatively high temperatures (from about 120° C. through about 1100° C.) using an embedded single-loop embedded heater element configured to make two full turns in the form of parallel concentric circles. An outer portion of the heater element may run adjacent to a perimeter of the support platter, while an inner portion runs on the path of a concentric circle having a smaller radius. The wiring to the heater element passes through the stem of the pedestal.

The substrate processing system is controlled by a system controller. In an exemplary embodiment, the system controller includes a hard disk drive, a floppy disk drive and a processor. The processor contains a single-board computer (SBC), analog and digital input/output boards, interface boards and stepper motor controller boards. Various parts of CVD system conform to the Versa Modular European (VME) standard which defines board, card cage, and connector dimensions and types. The VME standard also defines the bus structure as having a 16-bit data bus and a 24-bit address bus.

The system controller controls all of the activities of the CVD machine. The system controller executes system control software, which is a computer program stored in a computer-readable medium. Preferably, the medium is a hard disk drive, but the medium may also be other kinds of memory. The computer program includes sets of instructions that dictate the timing, mixture of gases, chamber pressure, chamber temperature, RF power levels, susceptor position, and other parameters of a particular process. Other computer programs stored on other memory devices including, for example, a floppy disk or other another appropriate drive, may also be used to instruct the system controller.

A process for depositing a film stack on a substrate or a process for cleaning a chamber can be implemented using a computer program product that is executed by the system controller. The computer program code can be written in any conventional computer readable programming language: for example, 68000 assembly language, C, C++, Pascal, Fortran or others. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled Microsoft Windows® library routines. To execute the linked, compiled object code the system user invokes the object code, causing the computer system to load the code in memory. The CPU then reads and executes the code to perform the tasks identified in the program.

The interface between a user and the controller is via a flat-panel touch-sensitive monitor. In the preferred embodiment two monitors are used, one mounted in the clean room wall for the operators and the other behind the wall for the service technicians. The two monitors may simultaneously display the same information, in which case only one accepts input at a time. To select a particular screen or function, the operator touches a designated area of the touch-sensitive monitor. The touched area changes its highlighted color, or a new menu or screen is displayed, confirming communication between the operator and the touch-sensitive monitor. Other devices, such as a keyboard, mouse, or other pointing or communication device, may be used instead of or in addition to the touch-sensitive monitor to allow the user to communicate with the system controller.

As used herein "substrate" may be a support substrate with or without layers formed thereon. The support substrate may be an insulator or a semiconductor of a variety of doping concentrations and profiles and may, for example, be a semiconductor substrate of the type used in the manufacture of integrated circuits. A layer of "silicon oxide" may include minority concentrations of other elemental constituents such as nitrogen, hydrogen, carbon and the like. In some embodiments of the invention, silicon oxide consists essentially of silicon and oxygen. A gas in an "excited state" describes a gas wherein at least some of the gas molecules are in vibrationally-excited, dissociated and/or ionized states. A gas (or precursor) may be a combination of two or more gases (precursors). The term "trench" is used throughout with no implication that the etched geometry has a large horizontal aspect ratio. Viewed from above the surface, trenches may appear circular, oval, polygonal, rectangular, or a variety of other shapes. The term "via" is used to refer to a low aspect ratio trench which may or may not be filled with metal to form a vertical electrical connection. The term "precursor" is used to refer to any process gas (or vaporized liquid droplet) which takes part in a reaction to either remove or deposit material from a surface.

Having described several embodiments, it will be recognized by those of skill in the art that various modifications, alternative constructions, and equivalents may be used without departing from the spirit of the invention. Additionally, a number of well-known processes and elements have not been described in order to avoid unnecessarily obscuring the present invention. Accordingly, the above description should not be taken as limiting the scope of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the precursor" includes reference to one or more precursor and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

What is claimed is:

1. A method of forming a silicon-and-oxygen-containing layer on a substrate in a substrate processing region in a substrate processing chamber, the method comprising:
    forming a silicon-and-nitrogen-containing layer on the substrate in the substrate processing region, wherein forming the silicon-and-nitrogen-containing layer comprises:
        flowing a stable gas into a plasma region to produce plasma effluents,
        combining a silicon-containing precursor with the plasma effluents in the plasma-free substrate processing region, wherein the silicon-containing precursor is carbon-free, and
        depositing a silicon-and-nitrogen-containing layer on the substrate; and
    curing the silicon-and-nitrogen-containing layer in an ozone-containing atmosphere in the same substrate processing region in the substrate processing chamber to form the silicon-and-oxygen-containing layer, wherein a substrate temperature during the curing operation is less than 50° C. higher than a substrate temperature during the operation of depositing the silicon-and-nitrogen-containing layer.

2. The method of claim 1 further comprising forming a second silicon-and-nitrogen-containing layer on the substrate in the substrate processing region, wherein forming the second silicon-and-nitrogen-containing layer comprises:
    flowing the stable gas into the plasma region to produce plasma effluents,
    combining a silicon-containing precursor with the plasma effluents in the substrate processing region, and
    depositing the second silicon-and-nitrogen-containing layer on the substrate in the substrate processing region; and
    curing the second silicon-and-nitrogen-containing layer in an ozone-containing atmosphere in the substrate processing region.

3. The method of claim 1 wherein the substrate processing region is plasma-free during the operation of forming the silicon-and-nitrogen-containing layer to avoid direct plasma-excitation of the silicon-containing precursor.

4. The method of claim 1 wherein the substrate processing region is plasma-free during the operation of curing the silicon-and-nitrogen-containing layer.

5. The method of claim 1 wherein a substrate temperature during the operation of depositing the silicon-and-nitrogen-containing layer is less than 100° C.

6. The method of claim 1 wherein a substrate temperature during the curing operation is less than 200° C.

7. The method of claim 1 wherein a thickness of the silicon-and-nitrogen-containing layer is less than or about 1500Å.

8. The method of claim 1 wherein the substrate is raised towards a heated showerhead to heat the substrate during the curing operation.

9. The method of claim 1 wherein the stable gas is a nitrogen-and-hydrogen-containing gas and the plasma effluents comprise a radical-nitrogen precursor.

10. The method of claim 9 wherein the nitrogen-and-hydrogen-containing gas comprises ammonia.

11. The method of claim 1 wherein the silicon-containing precursor comprises a silicon-and-nitrogen-containing precursor.

12. The method of claim 1 wherein the silicon-containing precursor comprises $N(SiH_3)_3$.

13. The method of claim 1 wherein the silicon-and-nitrogen-containing layer comprises a carbon-free Si—N—H layer.

14. The method of claim 1 further comprising raising a temperature of the substrate to an oxygen anneal temperature above or about 600° C. in an oxygen-containing atmosphere after the curing operation.

15. The method of claim 14 wherein the oxygen-containing atmosphere comprises one or more gases selected from the group consisting of atomic oxygen, ozone, and steam ($H_2O$).

16. The method of claim 1 wherein the substrate is patterned and has a trench having a width of about 45 nm or less, and wherein the silicon oxide layer formed in the trench is substantially void-free.

17. The method of claim 1 wherein the plasma region is in a remote plasma system.

18. The method of claim 1 wherein the plasma region is a partitioned portion of the substrate processing chamber separated from the plasma-free substrate processing region by a showerhead.

* * * * *